(12) United States Patent
Hogan

(10) Patent No.: US 6,278,386 B1
(45) Date of Patent: Aug. 21, 2001

(54) METHOD OF INHIBITING COPYING OF DIGITAL DATA BY ENCODING DECRYPTION DATE WITHIN ALTERNATIVE CHANNEL BIT SELECTIONS

(75) Inventor: Josh Hogan, Los Altos, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/134,145

(22) Filed: Aug. 14, 1998

Related U.S. Application Data

(60) Continuation of application No. 08/883,996, filed on Jun. 27, 1997, which is a division of application No. 08/606,697, filed on Feb. 26, 1996, now Pat. No. 5,699,434, which is a continuation-in-part of application No. 08/570,949, filed on Dec. 15, 1995, now abandoned.

(51) Int. Cl.$^7$ .............................. H03M 5/00; H03M 7/00
(52) U.S. Cl. ................................................. 341/58; 341/59
(58) Field of Search ...................... 326/8; 380/3; 341/58, 341/59, 69, 68, 95; 705/57; 369/59; 386/94; 360/60

(56) References Cited

U.S. PATENT DOCUMENTS

| | | | |
|---|---|---|---|
| 4,603,413 | 7/1986 | Sinjou et al. | 369/59 |
| 4,775,985 | 10/1988 | Busby | 375/25 |
| 5,122,912 | 6/1992 | Kanota et al. | 360/46 |
| 5,223,991 | 6/1993 | Nagai et al. | 360/72.2 |
| 5,231,546 * | 7/1993 | Shimada | 360/60 |
| 5,315,448 * | 5/1994 | Ryan | 360/60 |
| 5,375,249 | 12/1994 | Cho | 395/800 |
| 5,451,943 | 9/1995 | Satomura | 341/58 |
| 5,506,581 * | 4/1996 | Ino et al. | 341/58 |
| 5,523,853 * | 6/1996 | Yamashita et al. | 386/94 |
| 5,557,594 | 9/1996 | Chiba et al. | 369/59 |
| 5,592,450 | 1/1997 | Yonemitsu et al. | 369/48 |
| 5,638,064 * | 6/1997 | Mori et al. | 341/58 |
| 5,825,731 * | 10/1998 | Yokota | 369/48 |
| 5,991,499 * | 11/1999 | Yagasaki et al. | 386/94 |

FOREIGN PATENT DOCUMENTS

| | | |
|---|---|---|
| 0172439 A2 | 2/1986 | (EP) . |
| 0392506 A3 | 10/1990 | (EP) . |
| 0493044 A2 | 7/1992 | (EP) . |
| 0347934B1 | 1/1995 | (EP) . |
| 0674316 A2 | 9/1995 | (EP) . |

\* cited by examiner

Primary Examiner—Patrick Wamsley
(74) Attorney, Agent, or Firm—Augustus W. Winfield

(57) ABSTRACT

A method of inhibiting copying of digital data. In a first embodiment, a sequence of symbols is added to original data, the sequence of symbols selected to encode into channel bits having a large accumulated digital sum variance. The sequence of symbols is then encoded by a special encoder that generates special channel bits that don't have a large accumulated digital sum variance. The special channel bits may be unambiguously decoded, but the resulting decoded symbol sequence will likely be reencoded into channel bits having a large accumulated digital sum variance. In a second embodiment, a single symbol in the sequence of symbols is replaced after error correction symbols have been added. The sequence of symbols with one substituted symbol is encoded into channel bits that don't have a large accumulated digital sum variance. The resulting channel bits may be unambiguously decoded but the resulting symbol sequence will be error corrected and the error corrected symbol sequence will likely be reencoded into channel bits having a large accumulated digital sum variance. In a third embodiment, additional decryption or descrambling information or other data modification information is encoded into the sign of the digital sum variance of each blocked row of data. The decoded additional information is used to decrypt, descramble or otherwise modify the primary information. In variations of the third embodiment, decryption information is encoded into patterns of run lengths or in merge bits. In general, the embodiments and alternatives are independent and can be combined in complex ways to make reencoding difficult.

16 Claims, 7 Drawing Sheets

FIG 2

| | STATE 1 | STATE 2 | STATE 3 | STATE 4 |
|---|---|---|---|---|
| | CODE 4 | CODE 4 | CODE 4 | CODE 4 |
| | CODE 2 | CODE 2 | CODE 2 | CODE 2 |

214

| SYMBOL | STATE 1 | STATE 2 | STATE 3 | STATE 4 |
|---|---|---|---|---|
| 1 | CODE 1 | CODE 1 | CODE 1 | CODE 1 |
| 2 | | | | |
| 3 | | | | |
| ...80 | CODE 3 | CODE 3 | CODE 3 | CODE 3 |
| ...88 | | | | |
| 132 | CODE 2 | CODE 2 | CODE 2 | CODE 3 |
| 154 | CODE 3 | CODE 3 | CODE 3 | CODE 3 |
| 220 | CODE 3 | CODE 3 | CODE 2 | CODE 2 |
| 256 | CODE 3 | CODE 3 | CODE 2 | CODE 2 |

200

METHOD OF INHIBITING COPYING OF DIGITAL DATA BY ENCODING DECRYPTION DATE WITHIN ALTERNATIVE CHANNEL BIT SELECTIONS

CROSS-REFERENCE TO RELATED APPLICATIONS

The present application is a continuation application of Ser. No. 08/883,996 (filed Jun. 27, 1997), which is divisional application of Ser. No. 08/606,697 (filed Feb. 26, 1996, now U.S. Pat. No. 5,699,434), which is a continuation-in-part application of Ser. No. 08/570,949 (filed Dec. 15, 1995, abandoned). Application Ser. No. 08/606,697 and application Ser. No. 08/883,996 are hereby incorporated herein by reference.

FIELD OF INVENTION

This invention relates generally to transmission of digital data or recording of digital data in mass memory systems such as disks and tapes and more specifically to methods for preventing or inhibiting unauthorized copying.

BACKGROUND OF THE INVENTION

Digital information is often transmitted via network, microwave or satellite in a form that can be captured by anyone having the proper receiving equipment. Compact disks (CD's) and Digital Audio Tape (DAT) provide a single standard digital recording medium for data, software, images and audio. Proposed Multimedia Compact Disks, Digital Video Disks, Super Density Disks or other extensions of compact disk technology will provide higher capacity and bandwidth, enabling digital recording of video. For transmitted or recorded digital information, the ability to make an exact copy is often an essential attribute, enabling exchange, distribution and archiving of information. Sometimes, however, there is a need to prevent copying. For example, it is illegal to make an unauthorized copy of copyrighted material. Software, music and video providers have a need for distribution of copyrighted works in a digital form while preventing unauthorized copying of those works. There is a need for a method of selectively inhibiting copying of digital information. In the following application, the word "transmitting" is intended to include sending data to (and retrieving data from) a recording device. In general, recording will be used for illustration but the concepts apply equally well to other types of digital data transmission.

Digital data is rarely transmitted or recorded in its original digital form. Instead, high density digital transmission or recording typically involves numerous tradeoffs of various constraints, resulting in the original data being encoded into bit patterns that satisfy the various constraints. First, there is typically a tradeoff between recording density and error rate. A finite error rate imposes a requirement for additional information to be added for error detection and correction.

A second constraint deals with the highest permissible transition frequency. In magnetics, a related limitation is commonly called intersymbol interference. Typically, in the recording medium, each transition of state has some distorting effect on neighboring transitions. This distortion imposes a maximum on the number of consecutive transitions at a specified minimum spacing. Alternatively, in any recording medium, there is some maximum rate at which some physical phenomena can switch states.

A third typical constraint is self-clocking. For serial binary data, a clock signal for decoding the data often must be extracted from the timing of the transitions of a read signal (reversal of voltage or current, change of frequency or phase, change of light intensity, etc.). There must be an adequate frequency of transitions to keep the clock signal synchronized.

Serial binary data is often physically in a format called NonReturn to Zero Inverted (NRZI). In NRZI format, the waveform is at one state until a binary one occurs, at which time the waveform switches to an opposite state. The maximum transition rate or intersymbol interference limitations discussed above impose a minimum on the amount of time that can pass between transitions. The requirement for self clocking imposes a maximum on the amount of time that can pass with no transition. A code that satisfies the maximum transition rate constraint, the self-clocking constraint, and the NRZI format requirements is commonly called a Runlength Limited (RLL) code. In a RLL code, the number of consecutive binary zeros in the encoded bit pattern must be at least as large as a specified non-zero minimum and no greater than a specified maximum. For example, compact disks typically use a code specified as (2,10)-RLL which means that the number of consecutive zeros in the encoded bit pattern must be at least 2 and no greater than 10.

A fourth typical constraint on the encoded binary signal is a requirement for a limit on the low frequency content of the read signal. In many read channel detectors, a transition is indicated when the read signal crosses a fixed threshold. Any low frequency content in the read signal can cause an offset, restricting the dynamic range of the detector. In addition, for writeable optical disks, track following and focusing signals may be implemented using low frequency modulation of the read signal. Any low frequency content in the read signal may interfere with track following and focusing. Referring again to NRZI format, assign the value +1 to one state of a signal and assign the value −1 to the opposite state. A sum of these values (or the area under the curve) is called Digital Sum Variance (DSV) or alternatively Running Digital Sum (RDS). For many detectors, there is a specified maximum DSV or RDS, and any DSV exceeding the specified maximum is likely to cause data read errors or servo problems.

It is common to encode the original digital data into other digital data that satisfies the above constraints. Typically, the original data is divided into symbols, where a symbol is a small fixed number of bits, typically one byte (8 bits). Typically, each symbol is used as an index into a look-up table containing bit patterns (called channel bits) that satisfy the various constraints. For example, for compact disks, the current standard format divides the original data into 8-bit symbols, each 8-bit symbol being used as an index into a table of channel bit patterns, each channel bit pattern in the table having 14 bits. The corresponding encoder is commonly called an EFM encoder, for "eight-to-fourteen modulation." Each of the 14-bit patterns satisfies the (2,10)-RLL constraint described above. However, when one 14-bit pattern is concatenated with another, the combination of the end of one pattern and the beginning of another pattern may cause a violation of the (2,10)-RLL constraint and some strings of concatenated patterns may violate a DSV constraint. An additional 3 bits, called merge bits, are inserted between the 14-bit table patterns to merge the end of one pattern to the beginning of the next pattern. With appropriately selected merge bits, the resulting channel bits satisfy the (2,10)-RLL requirement and satisfy the DSV requirement. The net result is that for every 8 bits of un-encoded data, 17 bits are recorded (not fourteen as suggested by the name EFM).

For multimedia recording, an improvement to EFM encoding has been proposed, called EFMPlus. In EFMPlus, the encoder is a state machine. For each state of the state machine, there is a separate look-up table. In general, for each symbol, the corresponding channel bit pattern varies depending on the state. Note, however, that the channel bit pattern may be the same for at least two states. In addition, each table entry also specifies the next state. EFMPlus eliminates the merge bits, and instead uses slightly longer table entries and sophisticated substitution of alternative channel bit patterns. The encoder typically looks ahead to oncoming symbols and their possible alternative patterns, choosing the most appropriate pattern for both RLL and DSV. The net result of the EFMPlus proposal is that for every 8 bits of unencoded data, 16 bits are recorded, for a density improvement of about 6% relative to EFM. In the proposed standard for EFMPlus encoding, the look-up table entries are standard to enable unambiguous decoding. However, the encoder algorithms for deciding which alternative bit pattern and corresponding next state will typically vary from manufacturer to manufacturer. Therefore, different manufacturers may encode identical symbol sets into different binary channel bit sequences for recording, but all such sequences can be unambiguously decoded. For additional general information on Multimedia Compact Disks and EFMPlus, see for example, K. A. S. Immink, "EFMPlus: THE CODING FORMAT OF THE MULTIMEDIA COMPACT DISC," *IEEE Transactions on Consumer Electronics*, Vol. 41, No. 3, pp 491–497, August 1995.

Neither EFM or EFMPlus can completely guarantee satisfaction of the DSV constraint. In each encoding method, there are possible sequences of channel bits that can result in a large accumulated DSV. In EFMPlus, the encoder system designer can reduce the probability of a large accumulated DSV to some commercially acceptable probability but cannot reduce the probability to zero. Even though all permissible sequences of channel bits can be unambiguously decoded from a digital point of view, there are potential analog dynamic range problems in the read channel that may prevent proper decoding or that may interfere with tracking in writeable versions. There are opportunities to exploit this attribute to inhibit copying.

There are additional formatting details for proposed multimedia recording standards that create additional opportunities for copy protection. In proposed Digital Video Disk standards, original digital information is divided into blocks, each block including row and column error correction. There are opportunities to exploit various properties of block formatting to inhibit copying.

SUMMARY OF THE INVENTION

There are three embodiments. The first two embodiments exploit the fact that some sequences of symbols will likely be encoded by "standard" encoders into a sequence of channel bits that leads to a large accumulated DSV, and likely cannot be reliably detected by most read channels.

In a first embodiment, a special encoder encodes an original sequence of symbols into a sequence of channel bits that can be read by all decoders. Standard encoders will likely encode the same original sequence of symbols into a different sequence of channel bits that will lead to a large accumulated DSV. Therefore, the special channel bits can be unambiguously decoded but subsequent reencoding likely results in unreadable channel bits. The special encoder makes one or more nonoptimal (over the short term) choices of channel bits, placing the encoder into a state that prevents a long term propagation of states leading to a large accumulated DSV. An override switch may be employed to force the non-optimal choice.

In a second embodiment, one or more deliberate errors are introduced into the sequence of symbols after error correction symbols have been added. The resulting sequence of symbols with errors encodes to a sequence of channel bits that can be read by all decoders. However, the error-corrected symbol set likely encodes to a sequence of channel bits that result in a large accumulated DSV.

The third embodiment exploits an attribute of the data blocking format. A special encoder encodes additional information without adding overhead data. In a specific example, DSV is computed for each individual half-line of blocked data (where a half-line is 91 bytes including error correction and sync symbols) and information is encoded into the sign of the DSV values of blocked half-lines. In an alternative implementation, information is encoded into run length distribution. In either alternative, the encoding may be accomplished by choice of channel bits or by introduction of deliberate errors. The additional coded information is extracted by the decoder and passed on to a processor or higher level decoder for use in decrypting or de-scrambling the decoded symbols. Standard encoders will not generate the same pattern for the sign of the DSV of half-lines or the same runlength patterns when encoding the same original encrypted or scrambled symbols.

For each of the embodiments, the original data can be accurately recovered, but other encoders will likely encode the same original data into channel bits that cannot be recovered, or other encoders will encode the same original data into channel bits that don't include key decryption or descrambling information. The three embodiments are independent and any two or all three can be combined. The first two embodiments do not require any changes to proposed standards but each requires adding some additional overhead data. The third embodiment requires no additional overhead data, but requires decoders to have the ability to extract the additional information and pass the additional information on to a processor or higher level decoder.

BRIEF DESCRIPTION OF THE DRAWINGS

FIG. 2 is a table illustrating look-up tables of encoding patterns for a multiple state encoder.

DETAILED DESCRIPTION OF THE PREFERRED EMBODIMENT OF THE INVENTION

Figure 1:
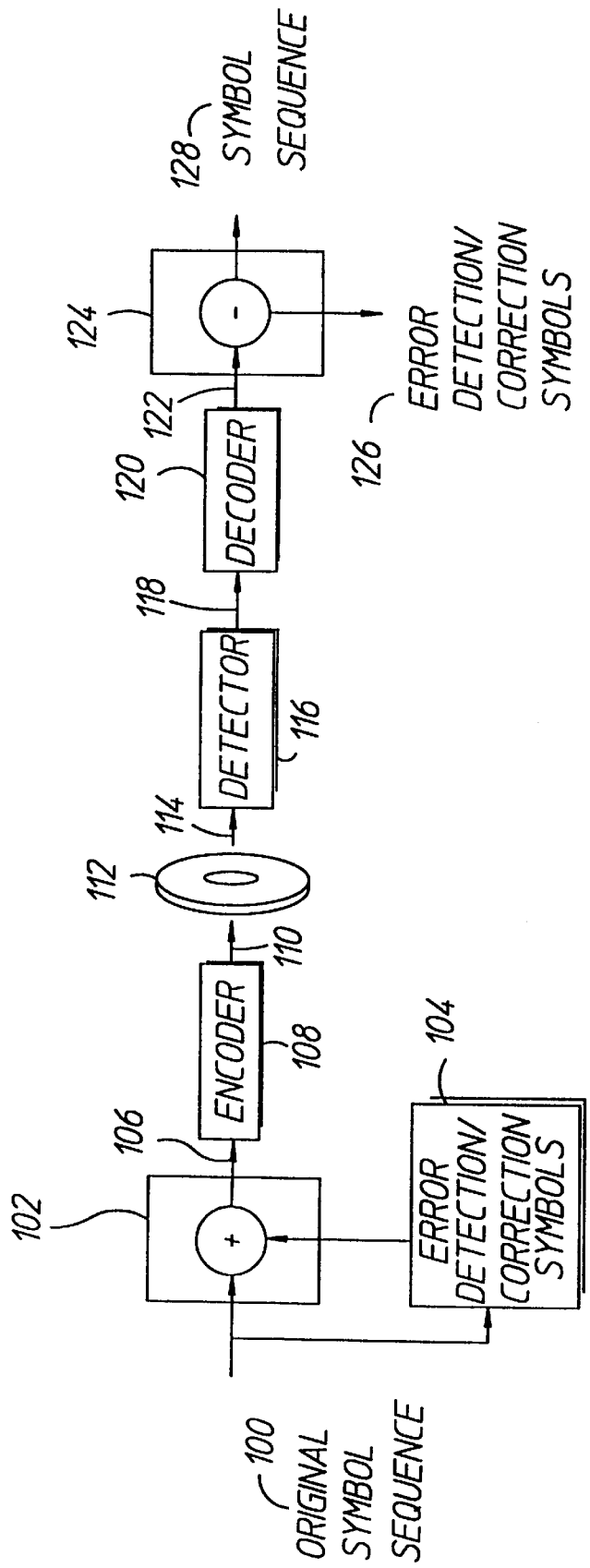
FIG. 1 is a block diagram of a digital recording system including the method of the invention.

FIG. 1 illustrates a digital recording system. The original data is divided in a sequence of symbols (100). In module 102, the data is blocked, additional symbols 104 are added for error detection and correction, and header and synchronization data are added. The modified sequence of symbols 106 is encoded by encoder 108 into a sequence of channel bits 110. The channel bits 110 are written onto a recording medium, depicted in FIG. 1 as a disk 112. A read signal 114 from the disk 112 is converted from an analog signal to a binary sequence 118 by detector 116. The binary sequence 118 is decoded by a decoder 120 into a symbol sequence 122. Error detection and correction, if appropriate, are performed in module 124 and the error detection and correction symbols 126 are stripped out along with other overhead data. The resulting final symbol sequence 128 ideally is identical to the original symbol sequence 100.

In a first embodiment of the invention, a special encoder 108 makes a nonoptimal channel bit decision for short term DSV that results in a sequence of channel bits 110 that is different than the sequence of channel bits that most other encoders will generate from the same original data 100. The special sequence of channel bits does not lead to a large accumulated DSV. The sequence of channel bits from other encoders likely leads to large accumulated DSV. It is unlikely that other encoders will make the same non-optimal choice for short term DSV.

In a second embodiment of the invention, deliberate errors are introduced into the symbol stream 106, after error correction symbols 104 have been added. The resulting decoded and error-corrected symbol sequence 128 is identical to the original symbol sequence. However, a different encoding system will not generate the same sequence of channel bits 110 unless it also introduces the same deliberate errors. Without the deliberate errors, the resulting sequence of channel bits leads to large accumulated DSV.

In a third embodiment of the invention, additional information is encoded by encoder 108 and decoded by decoder 124. The additional information is used for decryption, descrambling, or other data modification.

FIG. 2 illustrates look-up encoding tables for a multiple state encoder, as proposed in the EFMPlus proposal. In FIG. 2 there is a main look-up table 200 and a substitute table 214. The main look-up table 200 has code entries for 256 symbols (reference number 202) in four columns (reference numbers 204, 206, 208 and 210) corresponding to four possible states of a state machine. The number to the right of each code (for example, reference number 212) indicates the next state. For example, if the state machine is in state 1 (reference 204) encoding symbol 80, the state machine will then switch to state 3. In general, a particular channel bit pattern may be entered for multiple symbols, but at different states, thereby requiring a state dependent decoder. For symbols other than the first 88, there are typically two alternatives for the corresponding channel bits so that two of the four states result in one alternative and the other two states result in the other alternative. The substitute table 214 is available only for the first 88 symbols. For the first 88 symbols, the encoder can decide to use the code (and next state designation) from either the primary table 200 or the substitute table 214. For the first 88 symbols, the DSV of each sequence of channel bits in the main table is negative and the DSV of each sequence of channel bits in the substitute table are predominately positive. Only the first 88 rows provide a choice of channel bits at each state. Therefore, only the first 88 rows provide full DSV control, thereby providing the opportunity for the first embodiment of the invention.

Figure 3A:
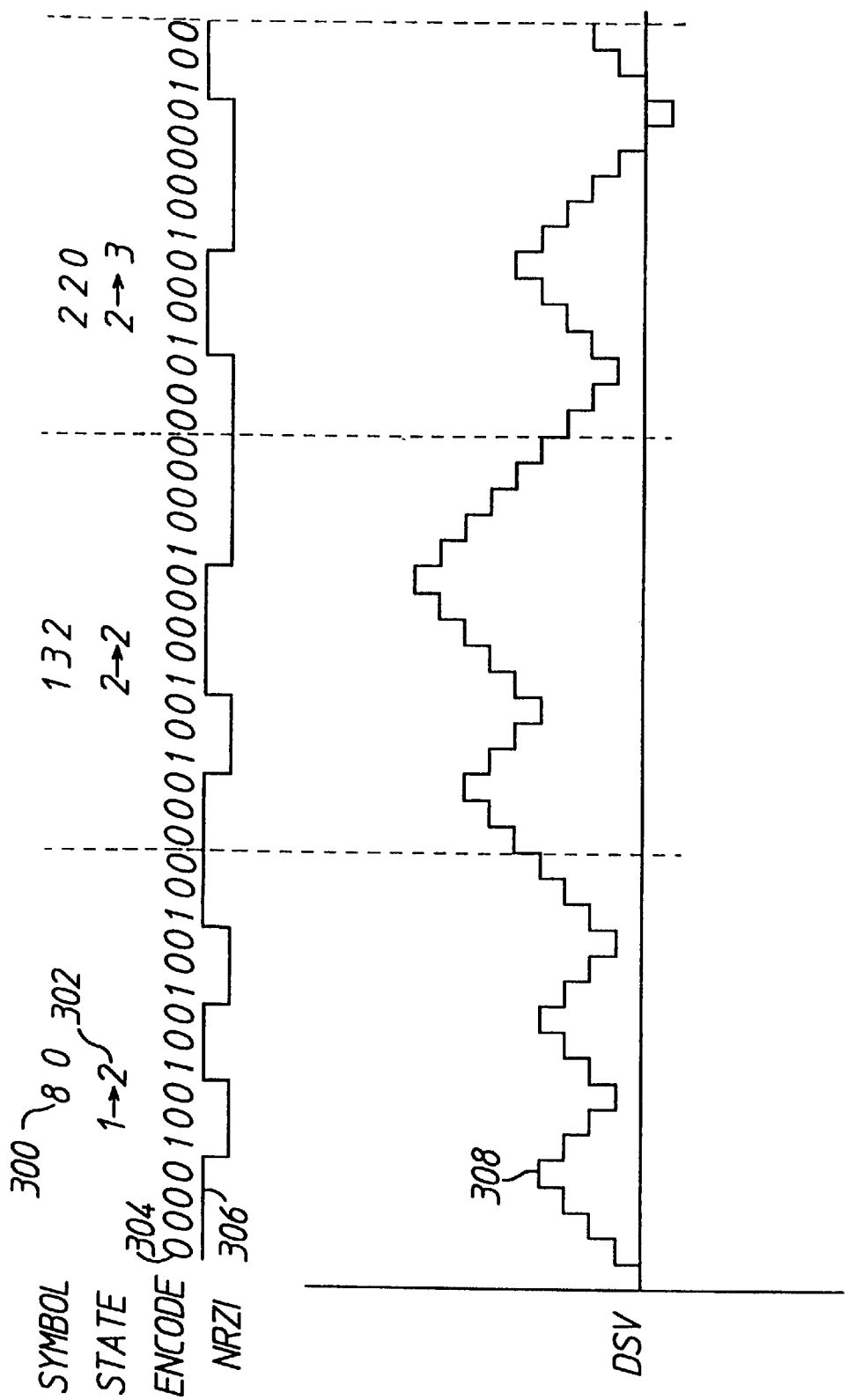
FIG. 3A is a graph of Digital Sum Value (DSV) resulting from a particular symbol sequence and a standard encoder.
Figure 3B:
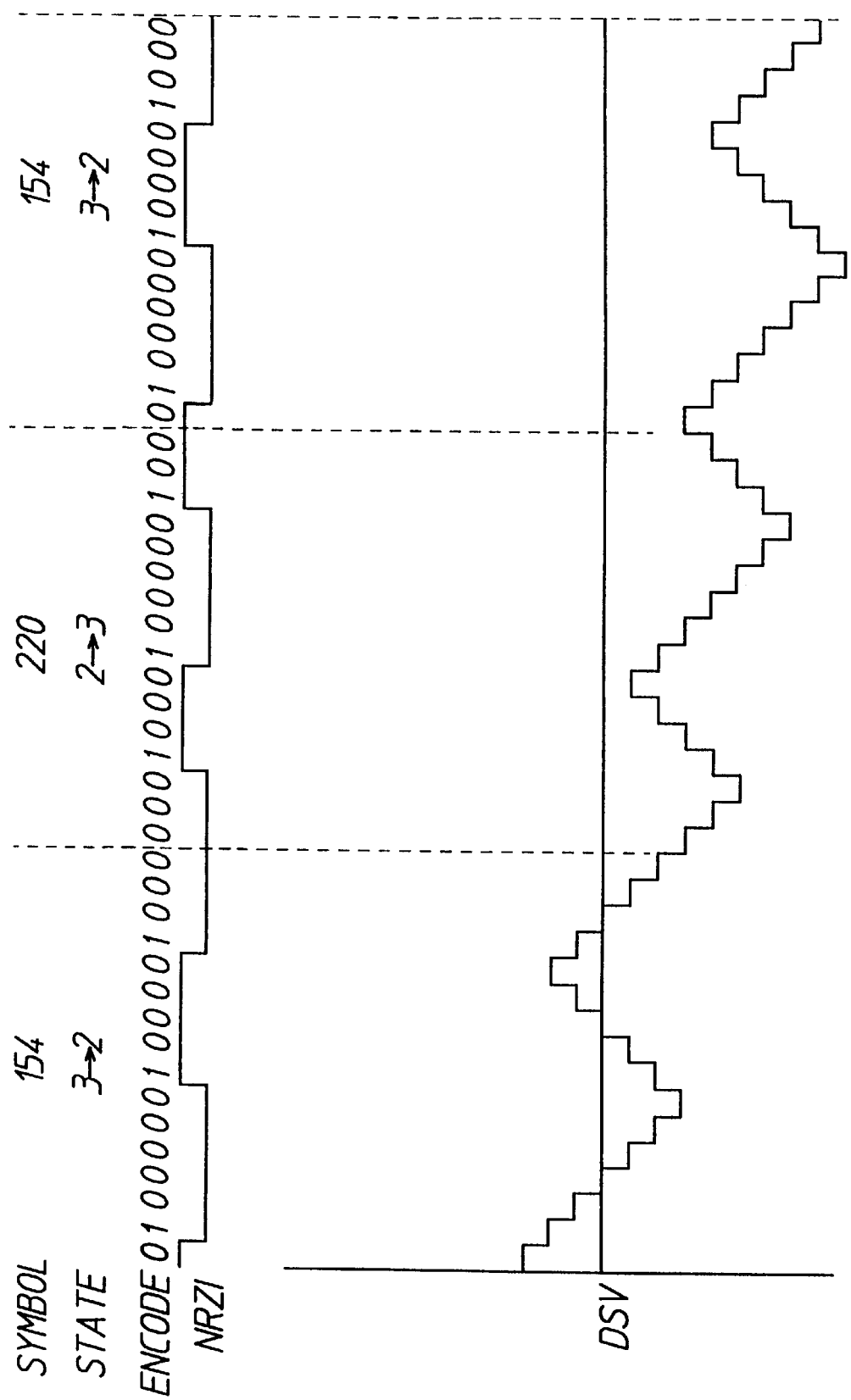
FIG. 3B is a continuation of FIG. 3A.

FIGS. 3A and 3B illustrate a symbol sequence: 80, 132, 220, 154, . . . , repeating 220, 154 (reference 300). In FIGS. 3A and 3B, a standard encoder in state 1 (reference 302) of the substitute table encodes symbol 80 to channel bits 0000100100100100 (reference 304) where the bits are written from left to right. An NRZI waveform 306 starts in a +1 state and stays at that state until the first binary one in the channel bits (starting from the left) at which time it switches states to −1. After 2 binary zeros in the channel bits, the NRZI waveform switches states again back to +1. DSV as plotted in FIGS. 3A–3D is the running sum of the NRZI waveform 306.

Figure 3C:
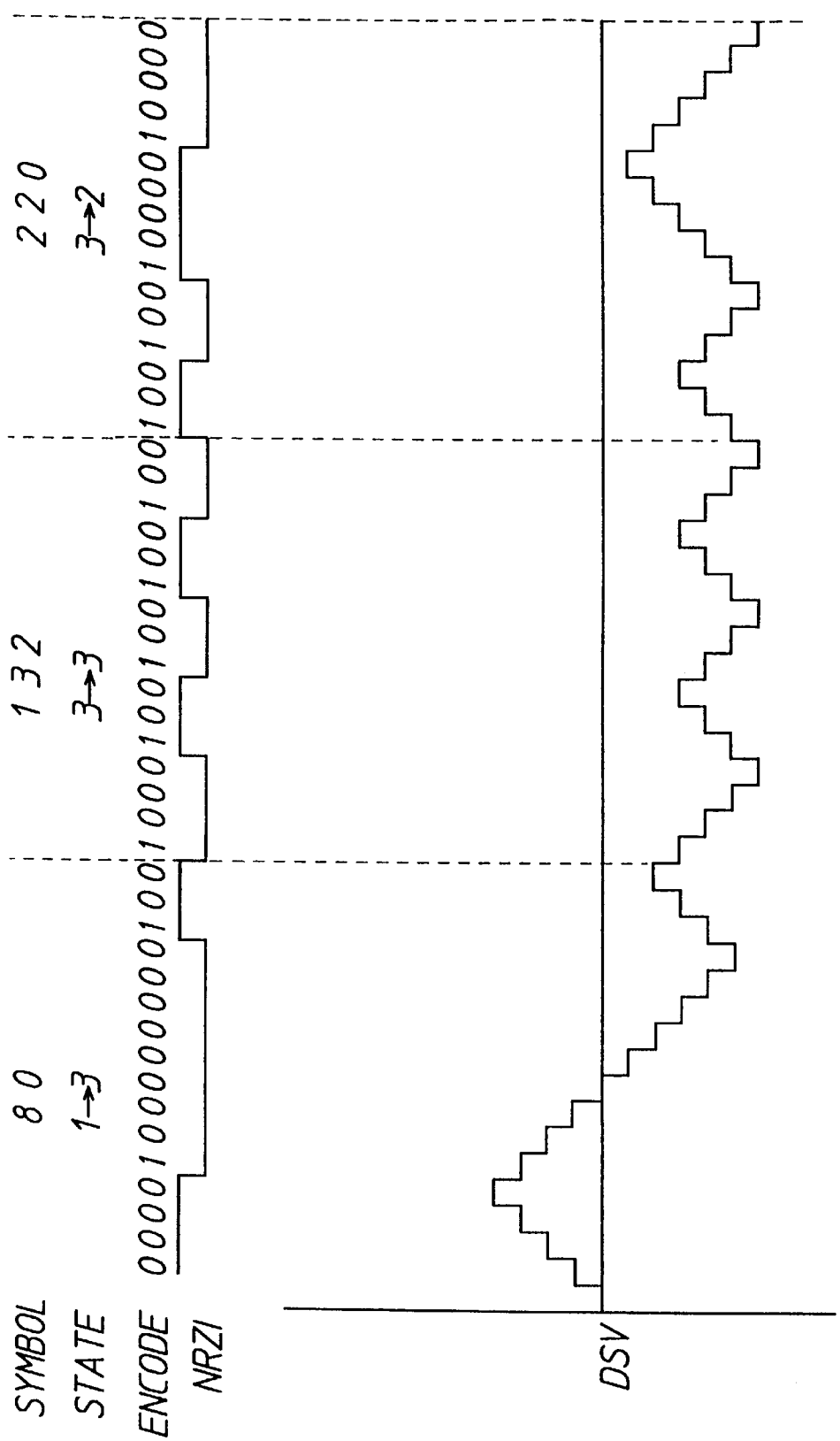
FIG. 3C is a graph of Digital Sum Value (DSV) for the same symbol sequence as in FIG. 3A but with a special encoder.
Figure 3D:
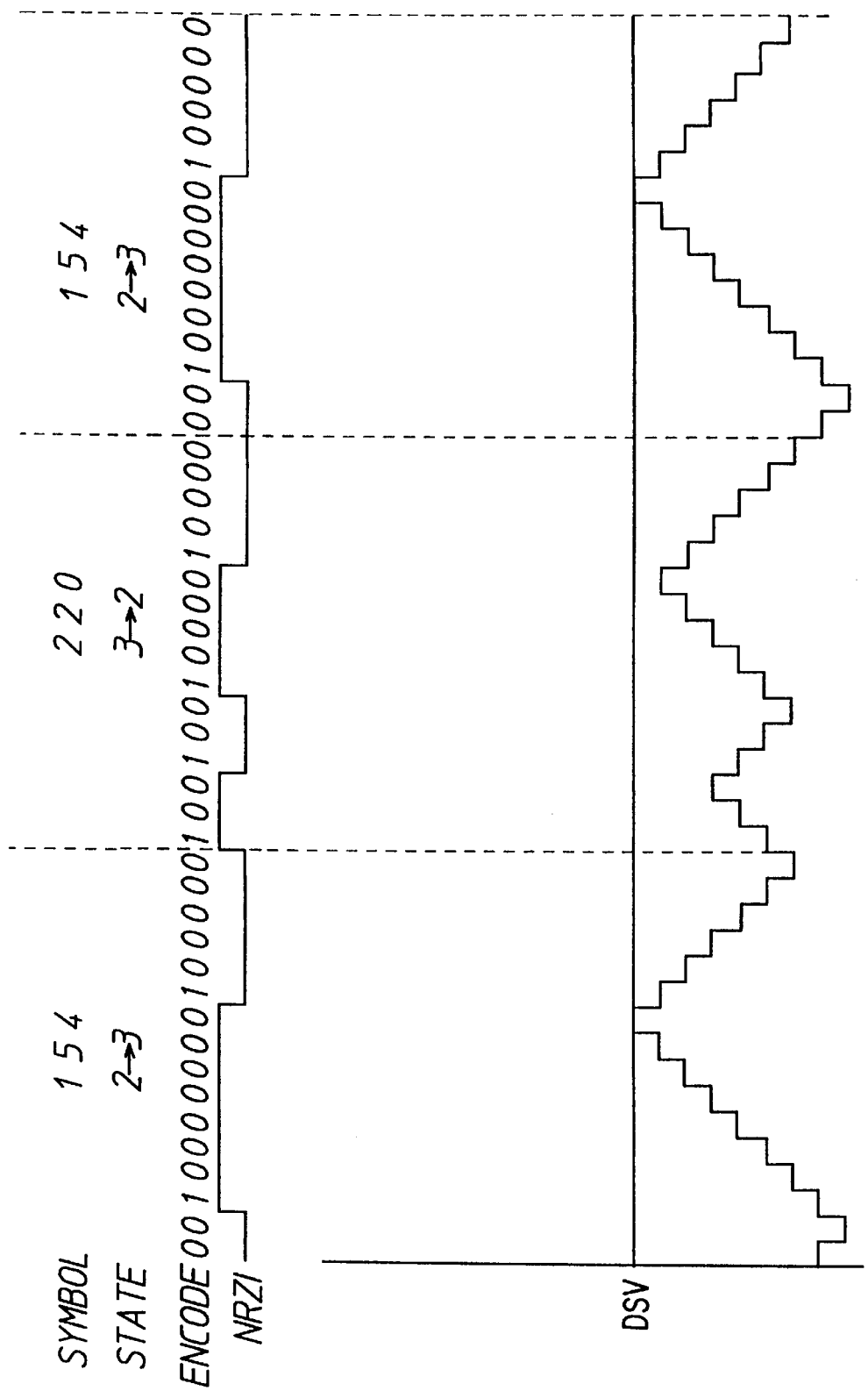
FIG. 3D is a continuation of FIG. 3C.

FIGS. 3C and 3D illustrate the same symbol sequence as FIGS. 3A and 3B but encoded by a special encoder. The special encoder starts in state 1 in the primary table (FIG. 2, reference 200). Encoders are expected to look ahead a few symbols (for example 2–3 symbols), examining all possible alternatives to determine the best choices for minimizing DSV. Compare the DSV waveforms for FIGS. 3A and 3C at the end of the third symbol (symbol 220). Also compare the DSV waveforms for FIGS. 3B and 3D at the end of the fourth symbol (symbol 154). In each case, the magnitude of DSV is smaller for the standard encoder (FIGS. 3A and 3B). For an encoder looking ahead two or three symbols to decide on which alternative channel bits to use, and given the two alternatives illustrated in FIGS. 3A–3D, the selection illustrated in FIGS. 3A and 3B is the optimal selection. In fact, however, the symbol sequence 80, 132, 220 has been contrived to bias or "trick" the encoder state machine into choosing a path that leads to state 2 for symbol 220. The alternative path from symbol 80 leads to state 3 for symbol 220. Symbol 132 biases the encoder to choose a desired path. If necessary, longer sequences could be used to ensure a particular state for a particular symbol, such as state 2 for symbol 220. Then, a repeating series of symbol 154 in state 3 followed by symbol 220 in state 2 back to symbol 154 in state 3 and so forth results in a repeating pattern where there are more zeros when the NRZI signal is in the −1 state than there are when the NRZI signal is in the +1 state and DSV accumulates in a negative direction indefinitely, as illustrated in FIG. 3B.

The key difference between the standard encoder of FIGS. 3A and 3B and the special encoder of FIG. 3C and 3D is that the special encoder makes an apparently less optimal choice for the first three symbols, entering the repeating sequence of symbol pairs (symbols 220, 154) from state 3 instead of state 2. The repeating codes for the resulting repeating states results in a DSV that does not accumulate, as illustrated in FIG. 3D. It is important to note that a single choice for the channel bits and corresponding state (for example, for symbol 80 in figure to 3A) can lead to propagation of an accumulating DSV by not allowing a way out of a particular state sequence. Alternatively, a single non-optimal choice for the channel bits and corresponding state can prevent propagation of a long undesirable sequence of states. The special encoder could be provided with a switch to force the non-optimal choice at the appropriate time.

A contrived sequence sufficiently long enough to ensure a large accumulated DSV necessarily substantially increases the overhead for a block of data. Therefore, the use should be limited. For copy protection of software, it is sufficient to have only a few blocks with the extra overhead sequences, but preferably with key software or data in these "protected" blocks. For video, individual "protected" blocks preferably occur once every 15 to 20 seconds. Because of the additional data overhead, any higher frequency of protected blocks might interfere with image quality. However, if the frequency is too low, protected blocks might complicate special features such as reverse play. For example, if information in each protected block is required for descrambling of subsequent video frames, reverse play would always have to reverse to a previous protected block to enable play of frames after that protected block.

The second embodiment is a variation of the first embodiment, also exploiting symbol sequences that lead to DSV violations. For example, consider again the symbol sequence in FIGS. 3A–3D (80, 132, 220, 154, 220, 154 . . . ) and refer back to FIG. 1. When module 102 blocks the symbols, the symbol sequence of FIGS. 3A–3D may be added to a block. Then, encoder 108 can be externally directed, for example by a processor, to substitute some other symbol for symbol 132. This substitute symbol is carefully chosen to bias the encoder 108 to choose state 3 for symbol 220, as in FIG. 3B. When the resulting channel bits are decoded, module 124 will detect the symbol error and correct the substitute symbol back to symbol 132, Then, any further encoding by standard encoders will be as in FIG. 3A, leading to a large accumulated DSV.

Figure 4:
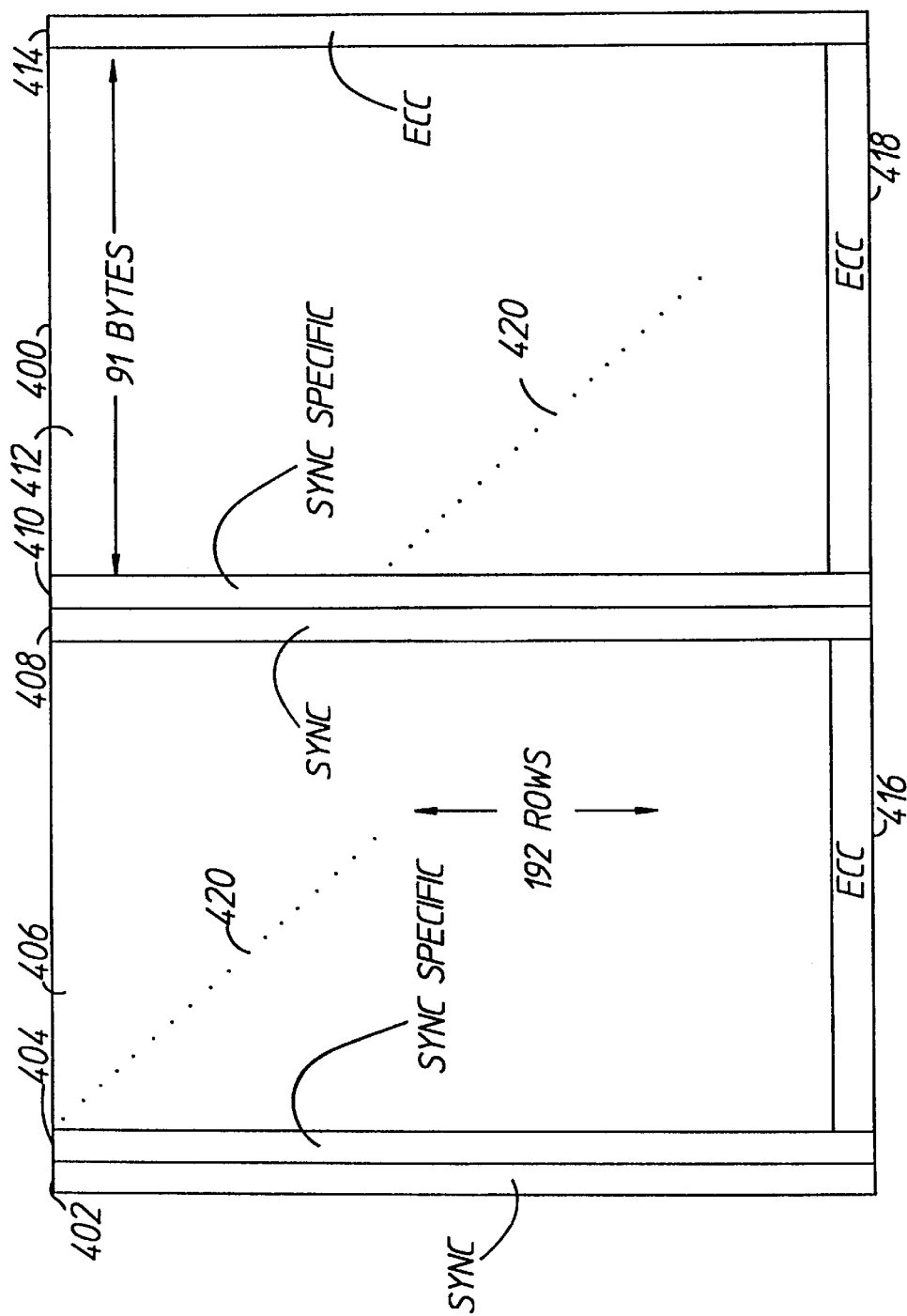
FIG. 4 is a block diagram of data formatted into a block, in accordance with proposed standards.

FIG. 4 illustrates one proposed format for blocking data. In FIG. 4, block 400 has 192 rows of data bytes. Each row has a series of synchronization bytes (402, 404) followed by 91 data bytes (406) followed by additional synchronization bytes (408, 410) followed by 91 data bytes (412) followed by error correction bytes (414) for the row. In addition, each column of 192 bytes has error correction bytes (416, 418). In one proposed format, part of the overhead for every half-row of 91 data bytes is sync data that can also serve as DSV control. This data is labeled as "sync specific" (404, 410) in FIG. 4. Note that a sync byte could reverse the direction of accumulation or force the state into a state sequence that leads to something other than state 2 for symbol 220. Therefore, for this proposed format, a sequence of accumulating DSV as discussed above may be interrupted every 91 bytes. The method described for the first embodiment can simply be restarted every 91 bytes. For deliberate errors however, if an error is introduced repeatedly in the same column for every row, the errors will overwhelm the column error correction capability and cannot be corrected. However, if multiple deliberate errors are placed along a diagonal (420), as illustrated in FIG. 4, there is only one deliberate error per row and only one deliberate error per column. Each deliberate error is then correctable by the row and column error correction codes. In a third embodiment, a special encoder encodes additional information that can be used for decryption or descrambling.

Referring to FIG. 4 again, each half-row has 91 symbols. It is possible to encode data into the DSV for each half-row of 91 symbols without causing any accumulated DSV and without impacting the overhead. For example, given a view of all 91 symbols for a half-row, channel bit selections can be made to ensure that the DSV for each half-row is either negative or positive. Alternatively, a deliberate error may be introduced on each half-row to ensure that the DSV for each half-row is either negative or positive. Alternatively, the DSV may be made to have a signed numerical value within a specified range. As a specific example, a single bit of information per row can be encoded as follows. Let the single bit be a logical one if the first half-row DSV is positive and the second half-row DSV is negative. Let the single bit be a logical zero otherwise. This encoding of the sign of the DSV by row provides 192 bits or 24 bytes per block. This additional data can be extracted by the decoder and provided to a processor or higher level decoder for use in decrypting, descrambling or otherwise modifying the original data. Decoding the special additional data is relatively simple (computing DSV for each half-row). Determining the proper sequences of channel bits, for example for the amount of data in a video, might require extensive off-line computation by a powerful computer. Therefore, it is highly unlikely that a standard encoder would produce the same special encoding.

As an alternative to encoding data in the DSV of half-rows, data may be encoded into the lengths of runs of binary zeros. By viewing an entire half-row, channel bit alternative decisions can be made to bias the runs of binary zeros without adding to data overhead or causing DSV problems. Alternatively, deliberate errors can be introduced to impact the runs of binary zeros. As an example, a single bit could be a logical one if there are more than X runs of Y or more zeros in the first half-row and there are less than X runs of Y or more zeros in the second half-row. Still another alternative is to simply count the number of transitions or ones in a line. Encoding could be based on whether the number is even or odd, or whether the number exceeds some threshold number. It is preferable to use a method that is immune to a small number of bit errors, for example, a threshold with some margin.

A version of encoding additional data can be implemented on present compact disks, using the three merge bits. Given a large number of data sequences, an encoder will have a choice of which merge bits to use and the encoder can use this choice to encode an encryption key. It can do this without diminishing DSV control. Decoders must have the additional ability to extract the information from the merge bits. One example implementation is as follows. If merge bits 100 or 001 have been used and either set of bits is equally valid, then neither will violate the (2,10) constraint. The encoder can, for example, use 100 to encode a binary zero and use 001 to encode a binary one (but only where either set of bits is equally valid). In this way, bits of information can be encoded, preferably with some parity bits, on a sequence of merge bits. This may require offline analysis to find a data sequence that allows flexibility in selecting the merge bits. The decoder may have to be directed to start at a specific address.

Note that video on a DVD for broad distribution may be compressed using a variable bit rate compression algorithm such as MPEG 2. It is unlikely that a DVD player with record capability will have the capability to recompress a copy using the same high quality compression technique. That is, a copy of a decompressed video will likely be of lower quality than the original. However, if compression occurs before encryption or scrambling, it may be possible to decrypt or descramble without decompressing, and then make a copy of the decrypted compressed data. Therefore, for copy protection, it is preferable to encrypt or scramble video data before compression and require a player to decrypt or descramble after decompression. However, the compression algorithms for video data depend on spatial and temporal correlation and encryption or scrambling of uncompressed digital data may interfere with compression. MPEG compression typically starts groups of frames with an intracoded frame (called an I-frame) which does not depend on information from previous frames. Successive frames after the I-frame are encoded as differences from other frames, using motion vectors. An I-frame and its following difference frames is typically called a group of pictures (GOP). A solution to scrambling before compression is to manipulate video data on the same GOP basis that the MPEG compression uses. One simple strategy is to randomly invert, horizontally or vertically, an I-frame image and all other images in the same GOP. Inversion of an entire GOP does not interfere with compression, but can render the video unwatchable.

Video scrambling and decoding can be implemented without requiring changes to standard readers. Proposed standards for video DVD include information at a specific address containing instructions to the reader's controller on how to read the video from the disk. If random inversion is employed for scrambling, the instruction block can include information on how to decode the inversion information and bow to use the decoded information to undo the random inversions. That is, the instruction block can provide the information on how to decode information previously encoded using encoding methods as described above in the third embodiment. The instruction block may then be made a "problem" block as described above in the first two embodiments of the invention, substantially complicating copying of the video, without requiring changes to proposed standards.

Note that encoding data into the sign or magnitude of the DSV and encoding data into run lengths can be combined. Finally, note that these are just examples of encoding information in ways that do not add overhead information. When alternative channel bit patterns are permitted, there are many alternative ways of encoding information in patterns of bits. For example, the state of the state machine provides an additional variable and the sync specific bytes provide an additional variable (if implemented). Note that all the alternatives discussed may be combined in complex combinations of DSV, sign and magnitude of DSV, run-length and others. The overall goal is provide encoding that is easy to decode but is difficult to reverse engineer and difficult to reencode.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of encoding first data within second data, the second data encoded into rows of channel bits, the method comprising the following steps:
   (a) encoding at least one bit of the first data into a parameter associated with a pattern of bits in the encoded rows of the second data;
   (b) encoding a row of the second data into channel bits having the parameter from step (a); and
   (c) transmitting the channel bits resulting from step (b).

2. The method of claim 1, further comprising using the first data for modifying the second data, the method comprising the following additional steps:
   (d) decoding the channel bits from step (c) into rows;
   (e) computing the parameter of step (a) for the row decoded in step (d);
   (f) decoding the parameter of step (e) back into the bit of step (a); and
   (g) using the decoded bit of step (f) to modify the decoded channel bits of step (d).

3. The method of claim 2 where the first data is decryption data and where step (g) further comprises:
   (g1) using the decoded bit of step (f) in decryption of the decoded channel bits of step (d).

4. The method of claim 1 where the parameter of step (a) is a pattern of signs, and step (b) further comprises:
   (b1) encoding a row of the second data into channel bits having a digital sum variance having the pattern of signs of step (a).

5. The method of claim 1 where the parameter of step (a) is a magnitude, and step (b) further comprises:
   (b1) encoding a row of the second data into channel bits having a digital sum variance with a magnitude greater than the magnitude of step (a).

6. The method of claim 1 where the parameter of step (a) is a magnitude, and step (b) further comprises:
   (b1) encoding a row of the second data into channel bits having a digital sum variance with a magnitude less than the magnitude of step (a).

7. The method of claim 1 where the parameter of step (a) is a numerical range, and step (b) further comprises:
   (b1) encoding a row of the second data into channel bits having a digital sum variance with a magnitude within the range of step (a).

8. The method of claim 1 where the parameter of step (a) is a numerical range, and step (b) further comprises:
   (b1) encoding a row of the second data into channel bits having a digital sum variance with a magnitude outside the range of step (a).

9. The method of claim 1 where the parameter of step (a) is a predetermined number of runs of binary zeros, the runs having a predetermined minimum length, and step (b) further comprises:
   (b1) encoding a row of the second data into channel bits having at least the predetermined number of runs of binary zeros having the predetermined minimum length specified in step (a).

10. The method of claim 1 where the parameter of step (a) is a predetermined number of runs of binary zeros, the runs having a predetermined minimum length, and step (b) further comprises:
    (b1) encoding a row of the second data into channel bits having less than the predetermined number of runs of binary zeros having the predetermined minimum length specified in step (a).

11. The method of claim 1 where the parameter of step (a) is a predetermined number of transitions between binary zero and binary one, and step (b) further comprises:
    (b1) encoding a row of the second data into channel bits having at least the predetermined number of transitions between binary zero and binary one specified in step (a).

12. The method of claim 1 where the parameter of step (a) is a predetermined number of transitions between binary zero and binary one, and step (b) further comprises:
    (b1) encoding a row of the second data into channel bits having fewer than the predetermined number of transitions between binary zero and binary one specified in step (a).

13. The method of claim 1 where the parameter of step (a) is whether a number of transitions between binary zero and binary one is even or odd, and step (b) further comprises:
    (b1) encoding a row of the second data into channel bits having an even number of transitions between binary zero and binary one.

14. The method of claim 1 where the parameter of step (a) is whether a number of transitions between binary zero and binary one is even or odd, and step (b) further comprises:
    (b1) encoding a row of the second data into channel bits having an odd number of transitions between binary zero and binary one.

15. The method of claim 1 where the parameter of step (a) is a predetermined number of binary ones, and step (b) further comprises:
    (b) encoding a row of the second data into channel bits having a number of binary ones that is at least the predetermined number of binary ones.

16. The method of claim 1 where the parameter of step (a) is a predetermined number of binary ones, and step (b) further comprises:
    (b1) encoding a row of the second data into channel bits having a number of binary ones that is less than the predetermined number of binary ones.

* * * * *

UNITED STATES PATENT AND TRADEMARK OFFICE
CERTIFICATE OF CORRECTION

PATENT NO.    : 6,278,386 B1  
DATED         : August 21, 2001  
INVENTOR(S)   : Hogan It is certified that error appears in the above-identified patent and that said Letters Patent is hereby corrected as shown below:

Column 10,
Line 57, delete "(b)" and insert therefor -- (b1) --

Signed and Sealed this

Fourth Day of November, 2003

JAMES E. ROGAN
*Director of the United States Patent and Trademark Office*